(12) United States Patent
Ramani et al.

(10) Patent No.: US 8,649,207 B2
(45) Date of Patent: Feb. 11, 2014

(54) SENSING RESISTANCE VARIABLE MEMORY

(75) Inventors: Pradeep Ramani, Boise, ID (US); John D. Porter, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/619,253

(22) Filed: Sep. 14, 2012

(65) Prior Publication Data

US 2013/0010528 A1  Jan. 10, 2013

Related U.S. Application Data

(60) Division of application No. 12/847,625, filed on Jul. 30, 2010, which is a continuation of application No. 12/053,140, filed on Mar. 21, 2008, now Pat. No. 7,787,282.

(51) Int. Cl.
*G11C 11/00* (2006.01)
(52) U.S. Cl.
USPC ............ 365/148; 365/185.03; 365/185.2; 365/185.22; 365/185.21
(58) Field of Classification Search
USPC ........ 365/148, 185.03, 185.2, 185.22, 185.21
See application file for complete search history.

(56) References Cited

U.S. PATENT DOCUMENTS

| | | | |
|---|---|---|---|
| 4,758,748 A | 7/1988 | Takeuchi | |
| 5,095,344 A | 3/1992 | Harari | |
| 5,163,021 A | 11/1992 | Mehrotra | |
| 5,172,338 A | 12/1992 | Mehrotra et al. | |
| 5,297,148 A | 3/1994 | Harari et al. | |
| 5,596,526 A | 1/1997 | Assar et al. | |
| 5,608,679 A | 3/1997 | Mi et al. | |
| 5,629,892 A * | 5/1997 | Tang | 365/185.2 |
| 5,638,318 A | 6/1997 | Seyyedy | |
| 5,675,537 A * | 10/1997 | Bill et al. | 365/185.22 |
| 5,889,699 A | 3/1999 | Takano | |
| 6,088,278 A | 7/2000 | Porter et al. | |
| 6,118,702 A * | 9/2000 | Shieh et al. | 365/185.11 |
| 6,128,244 A | 10/2000 | Thompson et al. | |
| 6,191,989 B1 * | 2/2001 | Luk et al. | 365/207 |
| 6,317,362 B1 * | 11/2001 | Nomura et al. | 365/185.2 |
| 6,438,038 B2 | 8/2002 | Ikehashi et al. | |
| 6,529,421 B1 | 3/2003 | Marr et al. | |
| 6,608,773 B2 | 8/2003 | Lowrey et al. | |
| 6,654,285 B1 * | 11/2003 | Fastow et al. | 365/185.2 |
| 6,700,814 B1 * | 3/2004 | Nahas et al. | 365/158 |
| 6,711,068 B2 * | 3/2004 | Lin et al. | 365/189.02 |
| 6,714,459 B2 | 3/2004 | Hirano | |

(Continued)

*Primary Examiner* — Viet Q Nguyen
(74) *Attorney, Agent, or Firm* — Brooks, Cameron & Huebsch, PLLC

(57) ABSTRACT

The present disclosure includes devices and methods for operating resistance variable memory. One device embodiment includes an array of memory cells wherein a number of the cells are commonly coupled to a select line, the number cells including a number of data cells programmable within a number of target threshold resistance ($R_t$) ranges which correspond to a number of data states, and a number of reference cells interleaved with the data cells and programmable within the number of target $R_t$ ranges. The aforementioned device embodiment also includes control circuitry coupled to the array and configured to sense a level associated with at least one data cell and at least one reference cell, and compare the sensed level associated with the at least one data cell with the sensed level associated with the at least one reference cell to determine a data state of the at least one data cell.

19 Claims, 7 Drawing Sheets

(56) References Cited

U.S. PATENT DOCUMENTS

| | | |
|---|---|---|
| 6,809,968 B2 | 10/2004 | Marr et al. |
| 6,822,907 B2 | 11/2004 | Maruyama et al. |
| 6,856,547 B2 | 2/2005 | Poidomani et al. |
| 6,906,951 B2 | 6/2005 | Wong |
| 6,958,661 B2 | 10/2005 | Thompson et al. |
| 6,963,506 B1 | 11/2005 | Wang et al. |
| 7,075,817 B2 | 7/2006 | Rinerson et al. |
| 7,084,695 B2 | 8/2006 | Porter |
| 7,085,166 B2 * | 8/2006 | Iwase et al. ............... 365/185.2 |
| 7,158,415 B2 | 1/2007 | Bedarida et al. |
| 7,164,604 B2 | 1/2007 | Arakawa |
| 7,177,188 B2 * | 2/2007 | Iwata et al. ............. 365/185.05 |
| 7,177,217 B2 | 2/2007 | Martines et al. |
| 7,180,386 B2 | 2/2007 | Thompson et al. |
| 7,251,178 B2 * | 7/2007 | Gogl et al. .................... 365/209 |
| 7,269,065 B2 | 9/2007 | Miyamoto |
| 7,310,013 B2 | 12/2007 | Porter |
| 7,336,532 B2 | 2/2008 | Chen |
| 7,345,905 B2 | 3/2008 | Pio et al. |
| 7,376,033 B2 * | 5/2008 | Suzuki ......................... 365/212 |
| 7,423,898 B2 * | 9/2008 | Tanizaki et al. ............... 365/148 |
| 7,551,465 B2 | 6/2009 | Ghilardi et al. |
| 7,554,861 B2 | 6/2009 | Vimercati et al. |
| 7,577,036 B2 | 8/2009 | Sarin et al. |
| 7,630,262 B2 | 12/2009 | Kang et al. |
| 7,630,263 B2 | 12/2009 | Pio |
| 7,778,098 B2 * | 8/2010 | Scade et al. ................ 365/210.1 |
| 7,787,307 B2 | 8/2010 | Sarin |
| 7,813,166 B2 * | 10/2010 | Jung et al. ..................... 365/158 |
| 7,843,726 B2 | 11/2010 | Roohparvar et al. |
| 7,881,134 B2 | 2/2011 | Sarin et al. |
| 7,885,131 B2 * | 2/2011 | Sakimura et al. ......... 365/210.12 |
| 7,907,444 B2 | 3/2011 | Sarin et al. |
| 7,924,623 B2 | 4/2011 | Goda et al. |
| 7,983,065 B2 * | 7/2011 | Samachisa ..................... 365/51 |
| 7,995,412 B2 | 8/2011 | Sarin et al. |
| 2003/0043640 A1 | 3/2003 | Marr et al. |
| 2003/0151956 A1 | 8/2003 | Marr et al. |
| 2006/0028287 A1 | 2/2006 | Thompson et al. |
| 2009/0027960 A1 | 1/2009 | Sarin et al. |
| 2009/0141558 A1 | 6/2009 | Sarin et al. |
| 2009/0237977 A1 | 9/2009 | Ramani et al. |

* cited by examiner

SENSING RESISTANCE VARIABLE MEMORY

PRIORITY INFORMATION

This application is a Divisional of U.S. patent application Ser. No. 12/847,625, filed Jul. 30, 2010, which is a Continuation of U.S. patent application Ser. No. 12/053,140 filed Mar. 21, 2008 and issued as U.S. Pat. No. 7,787,282 on Aug. 31, 2010, the specifications of which is incorporated by reference herein.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), flash memory, and resistance variable memory, among others.

Memory can be volatile or non-volatile. Volatile memory requires power to maintain the information stored therein, e.g., when power to volatile memory is lost, the information stored therein is also lost. Non-volatile memory, in contrast, does not lose the information stored therein in the absence of power, e.g., non-volatile memory can retain the information stored therein even if no power is being provided to the memory. Types of volatile memory include RAM, DRAM, and SDRAM, among others. Types of non-volatile memory include ROM, flash memory, and resistance variable memory, among others.

Types of resistance variable memory include programmable conductor memory, phase change random access memory (PCRAM), and resistive random access memory (RRAM), among others. A physical layout of a PCRAM memory device can resemble that of a DRAM device, except that the capacitor of the DRAM cell is replaced by a phase change material, e.g., the memory cells of the PCRAM device consist of a phase change material, such as Germanium-Antimony-Telluride (GST). A physical layout of an RRAM memory device may include memory cells including a variable resistor thin film, e.g., a colossal magnetoresistive material, which can be connected to a current controlling device, such as a diode, a field effect transistor (FET), or a bipolar junction transistor (BJT).

The memory cell material of a PCRAM device, e.g., GST, can exist in an amorphous, high resistance state, or a crystalline, low resistance state. The resistance state of the PCRAM cell, e.g., the GST, can be altered by applying current pulses to the cell. For example, the resistance state of the PCRAM cell, e.g., the GST, can be altered by heating the cell with a programming current. This results in the PCRAM cell being programmed to a program level which corresponds with the resistance state of the cell. In a binary system, for example, the amorphous, high resistance state can correspond to a logic state of 1, and the crystalline, low resistance state can correspond to a logic state of 0. The resistance of an RRAM cell, e.g., the variable resistor thin film, can be increased and/or decreased by applying positive and/or negative electrical pulses across the film. This results in the RRAM cell being programmed to a program level which corresponds with the resistance of the cell.

A single level memory cell (SLC) can represent two programmed levels as represented by the binary digits 1 or 0. Memory cells can also store more than two binary digits, e.g., 1111, 0111, 0011, 1011, 1001, 0001, 0101, 1101, 1100, 0100, 0000, 1000, 1010, 0010, 0110, and 1110. Such cells may be referred to as multi state memory cells, multibit cells, or multilevel cells (MLCs). MLCs can allow the manufacture of higher density memories without increasing the number of memory cells since each cell can represent more than one digit, e.g., more than one bit. Further, MLCs can have more than one programmed state, e.g., a cell capable of representing four digits can have sixteen programmed states. Non-volatile resistance variable memory can achieve MLC devices by programming a memory cell to one of a range of resistances.

The resistance of a resistance variable memory cell can be sensed in order to determine the data state of the cell. During a sensing operation, the resistance of a selected memory cell can be compared to a reference resistance in order to determine if the memory cell has a greater or lesser resistance, thereby indicating the content of the stored data. One type of sensing operation of PCRAM cells utilizes a trimmable resistor stack located in the periphery of the PCRAM. In this sensing operation, the same magnitude of current is applied to both the trimmable resistor stack and the PCRAM cell. The voltages across the trimmable resistor stack and PCRAM cell are then compared to determine the state of the PCRAM cell, e.g., to distinguish a 1 state from a 0 state.

Prior to the aforementioned sensing operation, the trimmable resistor stack can be trimmed to provide a preset reference that emulates the GST resistance. However, the resistance characteristics of GST may vary significantly with temperature, and the trimmable resistor stack may not track the resistance of the GST as the GST undergoes a temperature change. Hence, if the GST undergoes a temperature change after the trimmable resistance stack is trimmed, the preset reference of the trimmable resistance stack may no longer emulate the resistance of the GST. This can cause errors in the sensing operation of the PCRAM, which can render the PCRAM unreliable.

DETAILED DESCRIPTION

Figure 1:
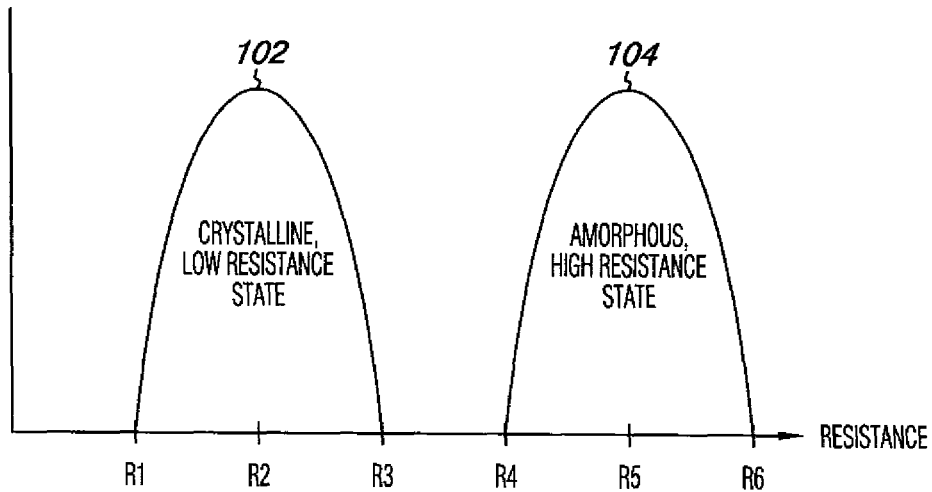
FIG. 1 is a diagram of target threshold resistance ($R_t$) ranges within which one or more resistance variable memory cells can be programmed in accordance with one or more embodiments of the present disclosure.

One or more embodiments of the present disclosure provide devices and methods for operating resistance variable memory, such as programmable conductor memory, resistance random access memory (RRAM), and phase change random access memory (PCRAM), among others. Embodiments use reference cells embedded with data cells as part of a sensing scheme that can have greater immunity to temperature changes and/or can be applicable to both single level and multilevel resistance variable memories.

One device embodiment can include an array of memory cells, wherein a number of the memory cells are commonly coupled to a select line. The aforementioned number of memory cells can include a number of data cells, each of which being programmable within a number of target threshold resistance ($R_t$) ranges which correspond to a number of data states, and a number of reference cells interleaved with the data cells, wherein each of the number of reference cells being programmable within the number of target $R_t$ ranges. The aforementioned device can also include control circuitry coupled to the array of memory cells and configured to sense a level associated with at least one data cell, sense a level associated with at least one reference cell, and compare the sensed level associated with the at least one data cell with the sensed level associated with the at least one reference cell to determine a data state of the at least one data cell.

One method embodiment can include programming at least one data cell of a number of data cells coupled to a select line within a target threshold resistance ($R_t$) range corresponding to one of a number of data states. The aforementioned method embodiment can also include sensing a level associated with the at least one data cell and at least one reference cell coupled to the select line and interleaved with the number of data cells. The aforementioned method embodiment can also include comparing the sensed level associated with the at least one data cell with the sensed level associated with the at least one reference cell to determine a data state of the at least one data cell.

In the following detailed description of the present disclosure, reference is made to the accompanying drawings that form a part hereof, and in which is shown by way of illustration how one or more embodiments of the disclosure may be practiced. These one or more embodiments are described in sufficient detail to enable those of ordinary skill in the art to practice the one or more embodiments of this disclosure, and it is to be understood that other embodiments may be utilized and that process, electrical, or mechanical changes may be made without departing from the scope of the present disclosure.

A phase change material can consist of a chalcogenide material, e.g., Germanium-Antimony-Telluride (GST). Chalcogenide materials can include compounds of sulfides, selenides, and tellurides, among others. A phase change material can include a number of Germanium-Antimony-Tellurium (GST) materials, e.g., Ge—Sb—Te such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include GeTe, In—Se, $Sb_2Te_3$, GaSb, InSb, As—Te, Al—Te, SbSe, Ge—Sb—Te, Ge—Sb—Se, Te—Ge—As, In—Sb—Te, Te—Sn—Se, Ge—Se—Ga, Bi—Se—Sb, Ga—Se—Te, Sn—Sb—Te, In—Sb—Ge, In—Sb—Se, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, and AgInSbSeTe, among others. However, embodiments of the present disclosure are not so limited, and can include impurities and the addition of other elements as well.

Some examples of resistive random access memory (RRAM) technologies can include binary metal oxide, perovskite oxide, colossal magnetorestive, and polymer, among others. Binary metal oxides can include $HfO_x$, $Nb_2O_5$, $Al_2O_3$, $WO_x$, $Ta_2O_5$, $TiO_x$, $ZrO_x$, $Cu_xO$, and $Ni_xO$, among others. Perovskite oxides can include doped or undoped $SrTiO_3$, $SrZrO_3$, and $BaTiO_3$, among others. Colossal magnetoresistive materials can include $Pr_{(1-x)}Ca_xMnO_3$ (PCMO), $La_{(1-x)}Ca_xMnO_3$ (LCMO), and $Ba_{(1-x)}Sr_xTiO_3$, among others. Polymer materials suitable for use with RRAM devices can include Bengala Rose, $AlQ_3Ag$, Cu-TCNQ, DDQ, TAPA, and Fluorescine-based polymers, among others. However, embodiments of the present disclosure are not so limited, and can include other RRAM technologies and/or other compounds.

A phase change material can be programmed to an amorphous, high resistance state, or a crystalline, low resistance state. The resistance state of a phase change material can be altered by applying external energy inputs, such as light, heat, electric fields, chemical catalysts, and stress-tension pressure, among others, to the material. For example, the resistance state of the phase change material can be altered by applying one or more programming pulses to the phase change material, e.g., heating the material with a programming current. The aforementioned application of external energy inputs to the phase change material can also alter other properties of the material, such as capacitance, dielectric constant, charge retention, index of refraction, surface reflection, light absorption, transmission, and scattering, differential wetting and absorption, and magnetic susceptibility, among others.

Phase change materials can be used to create resistance variable memory devices, e.g., programmable conductor memory, phase change random access memory (PCRAM), and resistive random access memory (RRAM) devices, among others. A single level memory cell (SLC), e.g., a cell which can represent two programmed levels with the binary digits 1 or 0, can be programmed to an amorphous, high resistance state corresponding to a first data state, e.g., 1 or 0, or a crystalline, low resistance state corresponding to a second data state, e.g., 0 or 1. The cell can be programmed to the amorphous, high resistance state by applying a programming pulse which can include a relatively high current pulse applied to the cell for a relatively short period of time. The current can then be quickly reduced after the phase change material "melts." This can allow the material to cool quickly, which can result in an amorphous state. The cell can be programmed to a crystalline, low resistance state by applying a programming pulse which can include a relatively low current applied to the cell for a relatively longer period of time. The current can then be slowly reduced. This can provide the phase change material with more time to cool, which can result in a crystalline state.

A phase change memory cell can be programmed to one or more intermediate states between amorphous and crystalline. That is, a phase change memory cell can be programmed to various levels of structural order. This can allow for a resistance variable memory device that can include multilevel cells (MLCs). For example, applying one or more programming pulses at various particular current levels to a phase change memory cell can program the cell to a given resistance level. With appropriate programming changes, phase change memory cells can be programmed to intermediate states having a partial amorphous and a partial crystalline structure, providing for multilevel resistance states. The number of programming levels chosen for a particular memory device can be based on the desired application, as well as design and processing limits, e.g., programming time, sensing time, and accuracy of sensing circuitry, among others.

The resistance of a resistance variable memory cell can be sensed in order to determine the data state of the cell. During a sensing operation, the resistance of a selected memory cell can be compared to a reference resistance in order to determine if the memory cell has a greater or lesser resistance, thereby indicating the content of the stored data.

A programming operation can be designed to program a resistance variable memory cell to a particular resistance level which corresponds to a particular data state. However, due to the characteristics of the resistance variable memory cell, e.g., GST, the cell may actually be programmed to a resistance level within a range of resistance levels, wherein the resistance levels within the range can correspond to the particular data state. That is, although the programming operation may not actually program the cell to the particular resistance level, the cell can still be programmed to the particular data state associated with the particular resistance level. This is because the particular data state can be associated with a number of resistance levels within a range of resistance levels, and programming the cell to a resistance level within this range can result in the cell being programmed to the particular data state. The range can include the particular resistance level.

FIG. 1 illustrates a diagram of target threshold resistance ($R_t$) ranges within which one or more resistance variable memory cells can be programmed in accordance with one or more embodiments of the present disclosure. As shown in the diagram illustrated in FIG. 1, target $R_t$ range 102 can be a crystalline, low resistance state, and target $R_t$ range 104 can be an amorphous, high resistance state. Target $R_t$ range 102 can correspond to a first data state, and target $R_t$ range 104 can correspond to a second data state. That is, a resistance level within target $R_t$ range 102 can correspond to the first data state, and a resistance level within target $R_t$ range 104 can correspond to the second data state. For example, target $R_t$ range 102 can correspond to a data state of "0," and target $R_t$ range 104 can correspond to a data state of "1." In the aforementioned example, a resistance level within target $R_t$ range 102 can correspond to a data state of "0," and a resistance level within target $R_t$ range 104 can correspond to a data state of "1." In the embodiment shown in FIG. 1, R1 and R3 are the lower and upper resistance levels of target $R_t$ range 102, and R4 and R6 are the lower and upper resistance levels of target $R_t$ range 104.

As shown in FIG. 1, target $R_t$ range 102 can contain resistance level R2, and target $R_t$ range 104 can contain resistance level R5. R2 and R5 can be resistance levels to which one or more resistance variable memory cells can be designed to be programmed, as previously described herein. However, embodiments of the present disclosure are not so limited. That is, the resistance level to which one or more resistance variable memory cells can be designed to be programmed can be a resistance level within the target $R_t$ range.

FIG. 1 illustrates one distribution pattern of resistance levels within target $R_t$ ranges that can occur when attempting to program a cell to a specific resistance level, e.g., R2 or R5. However, embodiments of the present disclosure are not so limited, and resistance levels within the target $R_t$ range may include other distribution patterns.

Although FIG. 1 illustrates two target $R_t$ ranges which correspond to two data states, embodiments of the present disclosure are not so limited, and may include a number of target $R_t$ ranges which correspond to a number of data states. That is, embodiments of the present disclosure are not limited to the two target $R_t$ ranges shown in FIG. 1, e.g., embodiments of the present invention are not limited to a crystalline, low resistance state and an amorphous high resistance state. Rather, embodiments of the present disclosure can include one or more intermediate resistance ranges between amorphous and crystalline, which correspond to one or more data states, as previously described herein.

Figure 2:
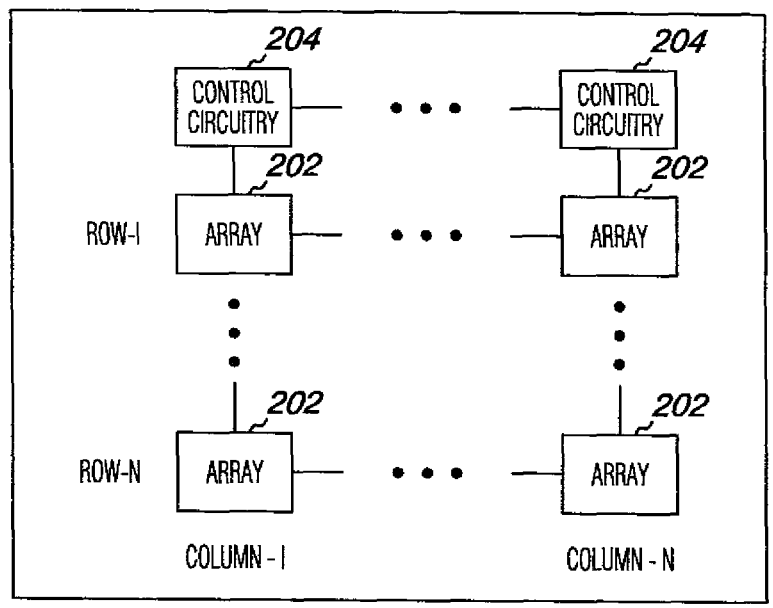
FIG. 2 is a block diagram of a memory chip that can be used with one or more embodiments of the present disclosure

FIG. 2 is a block diagram of a memory chip 200 that can be used with one or more embodiments of the present disclosure. As shown in FIG. 2, memory chip 200 can include a number of memory arrays, e.g., 202, arranged in rows, e.g., ROW-1, . . . , ROW-N, and columns, e.g., COLUMN-1, . . . , COLUMN-N. The use of the terms "rows" and "columns" is not meant to imply a particular linear horizontal and/or vertical orientation of the arrays. Rather, a row and/or column can mean a number of arrays that are logically connected, regardless of the orientation of the arrays. For example, a row and/or column can include a number of arrays that are logically connected in a staggered, e.g., non-linear, orientation.

Each array in a column can be coupled to control circuitry, e.g., control circuitry 204. As further described in connection with FIG. 7, control circuitry may include a sense amp used to sense reference levels associated with memory cells. Also, as further described herein, control circuitry may include a write driver used to program memory cells. Memory chip 200 may be one of a number of memory chips that are part of a resistance variable memory device in accordance with one or more embodiments of the present disclosure.

Figure 3:
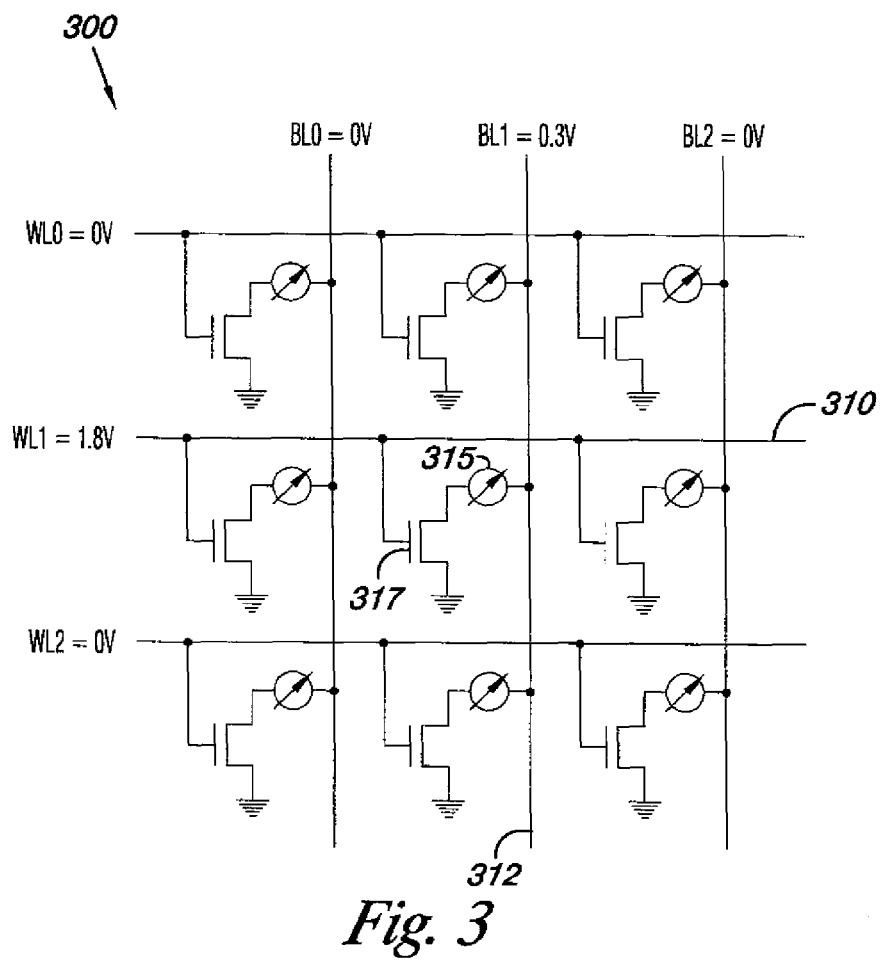
FIG. 3 is a schematic of a portion of an array of non-volatile memory cells that can be used with one or more embodiments of the present disclosure.

FIG. 3 is a schematic of a portion of an array 300, e.g., arrays 202 shown in FIG. 2, of non-volatile memory cells that can be used in a resistance variable memory device in accordance with one or more embodiments of the present disclosure. FIG. 3 illustrates a portion of a non-volatile metal-oxide-semiconductor field-effect-transistor (MOSFET)-based memory array 300. However, embodiments of the present disclosure are not so limited, and can include diode-based memory arrays and bipolar-junction transistor (BJT)-based memory arrays, among other types of access device-based memory arrays, as will be understood by one of ordinary skill in the art.

As shown in FIG. 3, array 300 can include select lines, e.g., 310. Array 300 can also include sense lines, e.g., 312, which can run perpendicular to the select lines. A select line, e.g., 310, can also be referred to as a word line, e.g., WL1, and a sense line, e.g., 312, can also be referred to as a bit line, e.g., BL1.

As shown in FIG. 3, array 300 can include non-volatile memory cells, e.g., 315, coupled to the select lines, e.g., 310, and the sense lines, e.g., 312, by access transistors, e.g., 317. A select line to which a number of non-volatile memory cells are coupled can be referred to as a row, e.g., ROW 0, ROW 1, ..., ROW N shown in FIGS. 4 and 5, and a sense line to which a number of non-volatile memory cells are coupled can be referred to as a column, e.g., COLUMN 0-D, COLUMN 1-D, ..., COLUMN N-D and COLUMN 0-R, COLUMN 1-R, ..., COLUMN N-R shown in FIG. 6. The use of the terms "rows" and "columns" is not meant to imply a particular linear horizontal and/or vertical orientation of the memory cells. Rather, a row can mean a number of memory cells coupled to a particular select line, regardless of the orientation of the memory cells, and a column can mean a number of memory cells coupled to a particular sense line, regardless of the orientation of the memory cells. For example, a row can include a number of memory cells coupled to a particular select line in a staggered, e.g., non-linear, orientation, and a column can include a number of memory cells coupled to a particular sense line in a staggered, e.g., non-linear, orientation.

Although the access transistors shown in the embodiment illustrated in FIG. 3 are MOSFETs, embodiments of the present disclosure are not so limited, and can include other types of transistors, e.g., BJTs. Also, embodiments of the present disclosure are not limited to transistors. For example, in one or more embodiments, element 317 can be an access diode. Each non-volatile memory cell can be located at an intersection of a select line and a sense line.

In one or more embodiments, the non-volatile memory cells, e.g., 315, can be resistance variable memory cells, e.g., programmable conductor memory cells, PCRAM cells, and RRAM cells, which contain resistance variable memory elements, e.g., a phase change element or a resistive switching element. In one or more embodiments, the non-volatile memory cells can be PCRAM cells made from a chalcogenide alloy of germanium, antimony, and tellurium (GST).

As illustrated in FIG. 3, to access a particular memory cell, e.g., 315, of array 300, a corresponding select line, e.g., WL1, can be biased at a first voltage, e.g., 1.8V, while surrounding select lines, e.g., WL0 and WL2, can be biased at a second voltage, e.g., 0V. A sense line, e.g., BL1, corresponding to the particular memory cell, e.g., 315, can then be biased at a first voltage, e.g., 0.3V, while surrounding sense lines, e.g., BL0 and BL2, can be biased at a second voltage, e.g., 0V. In this manner, individual memory cells can be accessed through their corresponding access device, e.g., transistor 417, to enable sensing of the memory cell, among other functions.

In one or more embodiments, and as further described in connection with FIG. 4, each row of non-volatile memory cells, e.g., the non-volatile memory cells coupled to a particular select line, can include a number of reference cells interleaved with the data cells of the row. For example, in the embodiment illustrated in FIG. 3, cell 315 can be a reference cell, and the other cells coupled to select line 310 can be data cells. The reference cells can be interleaved with the data cells of a given row in a variety of ways. In one or more embodiments, and as further described in connection with FIG. 4, each row of non-volatile memory cells, e.g., the non-volatile memory cells coupled to a particular select line, can include a number of reference cells embedded at an end of the row.

Figure 4:
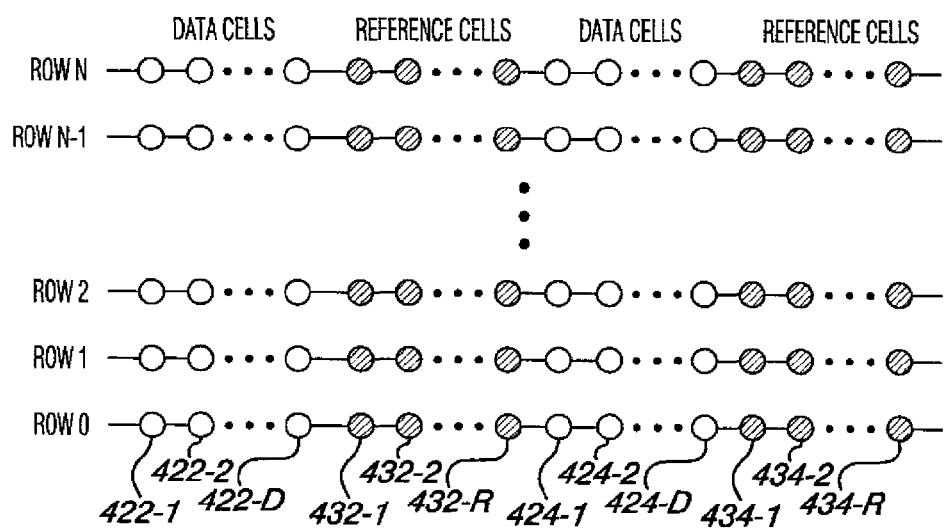
FIG. 4 is a schematic of a portion of an array of non-volatile memory cells having reference cells interleaved with data cells in accordance with one or more embodiments of the present disclosure.

FIG. 4 is a schematic of a portion of an array, e.g., arrays 202 shown in FIG. 2 or array 300 shown in FIG. 3, of non-volatile multilevel memory cells having reference cells interleaved with data cells in accordance with one or more embodiments of the present disclosure.

As shown in FIG. 4, the array can include a number of rows, e.g., ROW-0, ROW-1, ..., ROW N, of non-volatile memory cells. A row can be a select line, e.g., select line 310 shown in FIG. 3, to which a number of non-volatile memory cells, e.g., memory cell 315 shown in FIG. 3, are coupled, as previously described in connection with FIG. 3. The use of the term "rows" is not meant to imply a particular linear and/or horizontal orientation of the memory cells. Rather, a row can mean a number of memory cells coupled to a particular select line, regardless of the orientation of the memory cells. For example, a row can include a number of memory cells coupled to a particular select line in a staggered, e.g., non-linear, orientation. The index "N" is used to indicate that the array can include a number of rows, e.g., 16, 32, 64, etc. The cells on each row can be coupled to a select line, e.g., select line 310 shown in FIG. 3. The cells on each row can also be coupled to a sense line, e.g., sense line 312 shown in FIG. 3. As shown in the embodiment illustrated in FIG. 4, each row, e.g., ROW 0, ROW 1, ..., ROW N, of memory cells can include both data cells, e.g., 422-1, 422-2, ..., 422-D and 424-1, 424-2, ..., 424-D, and reference cells, e.g., 432-1, 432-2, ..., 432-R and 434-1, 434-2, ..., 434-R, interleaved therewith. As used herein, the term "interleaved" can mean interspersed among. That is, in one or more embodiments of the present disclosure, the reference cells can be interspersed among the data cells in the rows, as shown in FIG. 4. The reference cells can be interspersed among the data cells in a variety of manners, and embodiments of the present disclosure are not limited to the particular pattern shown in FIG. 4.

In one or more embodiments, the data cells and/or reference cells can be resistance variable cells, e.g., programmable conductor cells, PCRAM cells or RRAM cells, which contain resistance variable memory elements, e.g., a phase change element or a resistive switching element. In one or more embodiments, the data cells and reference cells can be PCRAM cells made from a chalcogenide alloy of germanium antimony, and tellurium (GST).

The number of memory cells, e.g., data cells and reference cells, per row can correspond to the number of columns, e.g., sense lines, in the array. The number of memory cells per row can be, for example, 4,256, 8,512, 16,384, or various other numbers. The number of memory cells per row may depend on factors such as the amount of overhead data associated with the user data. Each row can contain at least one reference cell.

The data cells and/or reference cells can be programmed within a number of target threshold resistance ($R_t$) ranges which can correspond to a number of data states, in accordance with programming methods described herein. In one or more embodiments, the target $R_t$ ranges within which the data cells are programmed correspond with the target $R_t$ ranges within which the reference cells are programmed. That is, in one or more embodiments, the data cells and reference cells can be programmed to the same data state.

Control circuitry, e.g., control circuitry 204 shown in FIG. 2, can sense reference levels associated with the data cells and reference cells, as further described in connection with FIG. 7. Control circuitry, e.g., control circuitry 204 shown in FIG. 2, can also compare the sensed reference levels to determine the $R_t$ levels and/or data states associated with the data cells, as further described in connection with FIG. 7.

In one or more embodiments, the reference cells and data cells in a particular row can be programmed during the same programming operation. This is beneficial because it ensures that the reference cells and data cells are exposed to the same or similar program cycling and program disturb conditions, e.g., temperature change. Also, in one or more embodiments, the reference cells and data cells in a particular row can be sensed during the same sensing operation. However, embodiments are not so limited, e.g., in one or more embodiments the reference cells and data cells in a particular row can be programmed and/or sensed during different programming and/or sensing operations.

In one or more embodiments, the reference cells can be physically the same as the data cells. For example, in one or more embodiments, the data cells and reference cells can both be resistance variable memory cells, e.g., programmable conductor cells, PCRAM cells, or RRAM cells. Also, in one or more embodiments, the data cells and reference cells can be programmed within the same target $R_t$ ranges which correspond with the same target data states, e.g., the same programming current can be used to program the data cells and reference cells. Further, in one or more embodiments, the same sense conditions can be used to sense the reference levels associated with the data cells and reference cells. For example, in one or more embodiments, the sense reference currents used to sense the reference levels associated with the data cells and reference cells can be the same for both the data cells and the reference cells.

In the embodiment illustrated in FIG. 4, the reference cells 432-1 to 432-R can represent a first group of reference cells interleaved with the data cells, and the reference cells 434-1 to 434-R can represent a second group of reference cells interleaved with the data cells. As used herein, the phrase "group of reference cells" can mean a number of adjacent reference cells in a particular row. Although the embodiment illustrated in FIG. 4 includes two groups of reference cells, e.g., 432-1 to 432-R and 434-1 to 434-R, embodiments are not limited to a particular number of groups of reference cells.

Each reference cell in a group of reference cells, e.g., 432-1 to 432-R and 434-1 to 434-R, can be programmed within a target $R_t$ range which can correspond to a data state, according programming methods described herein. In one or more embodiments, each reference cell in a group of reference cells can be programmed within the same target $R_t$ range which can correspond to the same data state, e.g., the same programming current can be used to program each reference cell in the group.

In one or more embodiments, the reference cells in a particular group and the data cells in the same row as the particular group of reference cells can be programmed during the same programming operation. This is beneficial because it ensures that the reference cells and data cells are exposed to the same or similar program cycling and program disturb conditions, e.g., temperature change. Also, in one or more embodiments, the reference cells in a particular group and the data cells in the same row as the particular group of reference cells can be sensed during the same sensing operation. However, embodiments are not so limited, e.g., in one or more embodiments the reference cells in a particular group and the data cells in the same row as the particular group of reference cells can be programmed and/or sensed at a different programming and/or sensing operations. The indices "D" and "R" are used to distinguish the data cells, e.g., 422-1, 422-2, ..., 422-D and 424-1, 424-2, ..., 424-D, from the reference cells, e.g., 432-1, 432-2, ..., 432-R and 434-1, 434-2, ..., 434-R, in a row, e.g., ROW 0, ROW 1, ..., ROW N, and also to indicate that the groups of reference cells, e.g., 432-1 to 432-R and 434-1 to 434-R, can include a number of reference cells. The number of reference cells in each group can depend on a variety of factors such as the type of multilevel cells, e.g., 2-bit or 4-bit MLCs, and the number of data cells per row.

In one or more embodiments, the number of groups of reference cells can correspond with the number of target $R_t$ ranges and/or data states the memory cells are programmed within/to. That is, the number of groups of reference cells can be four, e.g., for two-bit multilevel cells, eight, e.g., for three-bit multilevel cells, sixteen, e.g., for four-bit multilevel cells, etc.

Each group of reference cells can be programmed within a different target $R_t$ range which can correspond to a different data state. In one or more embodiments, each group of reference cells can be programmed within a target $R_t$ range which can correspond to the target $R_t$ range within which the data cells are programmed. That is, in one or more embodiments, each group of reference cells can be programmed to a target data state which can correspond to the target data state to which the data cells are programmed. Additionally, in such embodiments, the data cells and groups of reference cells being programmed to corresponding data states can be programmed during the same programming operation. This is beneficial because it ensures that the data cells and associated group of reference cells being programmed within that particular target $R_t$ range which can correspond to that particular data state experience the same or similar program disturb conditions or other data degradation mechanisms, e.g., temperature change. As an example, assume a number of data cells, e.g., 422-1, 422-2, ..., 422-D and 424-1, 424-2, ..., 424-D, are to be programmed to a number of different data states, e.g., the data state "1101" is to be programmed to some of the data cells 422-1, 422-2, ..., 422-D and 424-1, 424-2, ..., 424-D, the data state "0101" is to be programmed to some other of the data cells 422-1, 422-2, ..., 422-D and 424-1, 424-2, ..., 424-D, etc. For four-bit MLCs, it is possible that each of the sixteen data states will be written to at least some of the data cells. In this example, the data cells that are to be programmed to the "1101" data state and the reference cells in the group of reference cells that are to be programmed to the "1101" data state can be programmed during the same programming operation. Additionally, the data cells that are to be programmed to the "0101" data state and the reference cells in the group of reference cells that are to be programmed to the "0101" data state can be programmed during the same programming operation, etc.

In one or more embodiments, control circuitry, e.g., control circuitry 204 shown in FIG. 2, can be configured to perform an averaging of the sensed reference levels associated with the reference cells in a sensed group of reference cells programmed within a particular target $R_t$ range in order to determine an average reference level associated with the sensed group. Control circuitry, e.g., control circuitry 204 shown in FIG. 2, can also be configured to compare this average reference level with the sensed reference level associated with the data cells in the same row that were programmed within the particular target $R_t$ range in order to determine the data state of the data cells.

For example, assume that a number of data cells, e.g., 422-1, 422-2, ..., 422-D and 424-1, 424-2, ..., 424-D in a row, e.g., ROW 0, ROW 1, ..., ROW N, and an associated group of reference cells, e.g., 432-1 to 432-R and 434-1 to 434-R, interleaved with the data cells are programmed within a particular target $R_t$ range which can correspond to a particular target state, e.g., "01" for a two-bit cell. Control circuitry, e.g., control circuitry 204 shown in FIG. 2, can perform a sensing operation to determine the present $R_t$ level and/or reference level of the data cells and the reference cells in the associated group. The control circuitry can then perform an averaging of the present levels of the reference cells in the group, and can compare these average levels with the presently sensed levels of the data cells to determine the present data state, e.g., "01," of the data cells.

In one or more embodiments, control circuitry, e.g., control circuitry 204 shown in FIG. 2, can be configured to determine a most common reference level associated with the reference cells in a sensed group of reference cells programmed within a particular target $R_t$ range. As used herein, "most common reference level" can mean the most frequently sensed reference level during a sensing operation. The control circuitry can also be configured to compare this most common reference level with the sensed reference level associated with the data cells in the same row that were programmed within the particular target $R_t$ range in order to determine the data state of the data cells.

Figure 5:
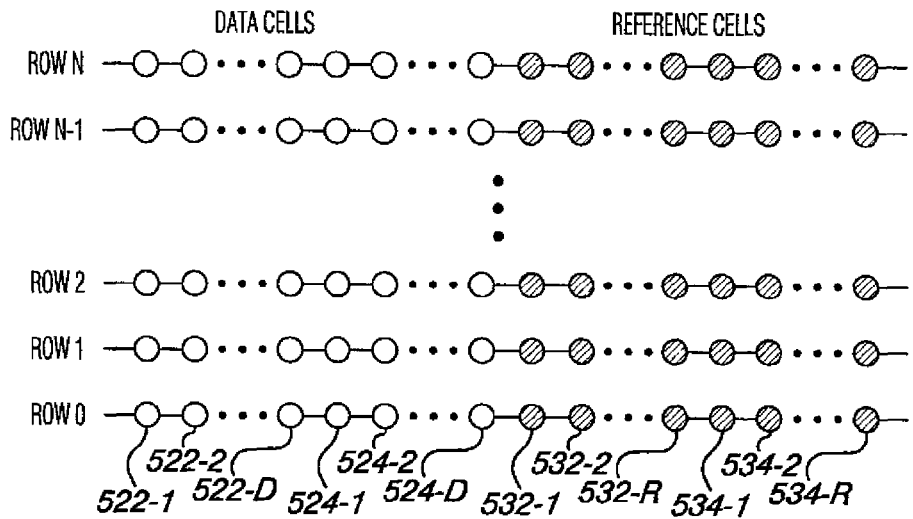
FIG. 5 is a schematic of a portion of an array of non-volatile memory cells having reference cells embedded at an end of the rows of the array in accordance with one or more embodiments of the present disclosure.

FIG. 5 is a schematic of a portion of an array, e.g., arrays 202 shown in FIG. 2 or array 300 shown in FIG. 3, of non-volatile multilevel memory cells having reference cells embedded at an end of the rows of the array in accordance with one or more embodiments of the present disclosure.

As shown in FIG. 5, the array can include a number of rows of non-volatile memory cells, e.g., ROW-0, ROW-1, . . . , ROW N. A row can be a select line, e.g., select line 310 shown in FIG. 3, to which a number of non-volatile memory cells, e.g., memory cell 315 shown in FIG. 3, are coupled, as previously described in connection with FIG. 3. The use of the term "rows" is not meant to imply a particular linear and/or horizontal orientation of the memory cells. Rather, a row can mean a number of memory cells coupled to a particular select line, regardless of the orientation of the memory cells. For example, a row can include a number of memory cells coupled to a particular select line in a staggered, e.g., non-linear, orientation. The index "N" is used to indicate that the array can include a number of rows, e.g., 16, 32, 64, etc. The cells on each row are coupled to a select line, e.g., select line 310 shown in FIG. 3. Each of the cells are also coupled to a sense line, e.g., sense line 312 shown in FIG. 3.

As shown in the embodiment illustrated in FIG. 5, each row, e.g., ROW 0, ROW 1, . . . , ROW N, of memory cells can include data cells, e.g., 522-1, 522-2, . . . , 522-D and 524-1, 524-2, . . . , 524-D. Each row of memory cells also can include reference cells, e.g., 532-1, 532-2, . . . , 532-R and 534-1, 534-2, . . . , 534-R, embedded at an end of the row. Although the reference cells are embedded at one end of the row in the embodiment shown in FIG. 5, embodiments of the present disclosure are not so limited, and can include one or more embodiments in which the reference cells are embedded at the other end of the row, or at both ends of the row.

The memory cells, e.g., the data cells and reference cells, shown in the embodiment illustrated in FIG. 5 are analogous to the memory cells, e.g., data cells and reference cells, shown in the embodiment illustrated in FIG. 4. That is, the memory cells, e.g., data cells and reference cells, of non-volatile memory arrays having reference cells interleaved with the data cells in accordance with one or more embodiments of the present disclosure are analogous to the memory cells, e.g., data cells and reference cells, of non-volatile memory arrays having reference cells embedded at an end of the rows of the array in accordance with one or more embodiments of the present disclosure. Further, the programming and sensing of the memory cells shown in the embodiment illustrated in FIG. 5 are analogous to the programming and sensing of the memory cells shown in the embodiment illustrated in FIG. 4. That is, the programming and sensing of the memory cells of non-volatile memory arrays having reference cells interleaved with the data cells in accordance with one or more embodiments of the present disclosure are analogous to the programming and sensing of the memory cells of non-volatile memory arrays having reference cells embedded at an end of the rows of the array in accordance with one or more embodiments of the present disclosure.

In the embodiment illustrated in FIG. 5, the reference cells 532-1 to 532-R can represent a first group of reference cells embedded at an end of the row, e.g., ROW 0, ROW 1, . . . , ROW N, and the reference cells 534-1 to 534-R can represent a second group of reference cells embedded at an end of the row. As used herein, the term "group of reference cells" can mean a number of adjacent reference cells in a particular row. Although the embodiment illustrated in FIG. 5 includes two groups of reference cells, e.g., 532-1 to 532-R and 534-1 and 534-R, embodiments are not limited to a particular number of groups of reference cells.

The groups of reference cells, e.g., 532-1 to 532-R and 534-1 to 534-R, shown in the embodiment illustrated in FIG. 5 are analogous to the groups of reference cells, e.g., 432-1 to 432-R and 434-1 to 434-R, shown in the embodiment illustrated in FIG. 4. That is, the groups of reference cells of non-volatile memory arrays having reference cells interleaved with the data cells in accordance with one or more embodiments of the present disclosure are analogous to the groups of reference cells of non-volatile memory arrays having reference cells embedded at an end of the rows of the array in accordance with one or more embodiments of the present disclosure. Further, the programming and sensing of the groups of reference cells shown in the embodiment illustrated in FIG. 5 are analogous to the programming and sensing of the groups of reference cells shown in the embodiment illustrated in FIG. 4. That is, the programming and sensing of the groups of reference cells of non-volatile memory arrays having reference cells interleaved with the data cells in accordance with one or more embodiments of the present disclosure are analogous to the programming and sensing of the groups of reference cells of non-volatile memory arrays having reference cells embedded at an end of the rows of the array in accordance with one or more embodiments of the present disclosure.

Interleaving the reference cells with the data cells and/or embedding the reference cells at an end of the row in a resistance variable non-volatile memory array in accordance with one or more embodiments of the present disclosure can have several benefits. For example, including both the data cells and reference cells in the array can help ensure the data cells and reference cells experience the same or similar program disturb conditions or other data degradation mechanisms, e.g., the data cells and reference cells can experience the same or similar temperature changes. As previously described herein, the characteristics of resistance variable memory cells can vary significantly with temperature. However, including both the data and reference cells in the array can help ensure that their characteristics track, e.g., undergo the same or similar changes, with temperature change. This can help ensure accuracy in sensing operations. That is, interleaving the reference cells with the data cells and/or embedding the reference cells at an end of the row can result in a resistance variable memory device that has greater immunity to temperature change.

Further, having each row in a resistance variable non-volatile memory array contain at least one reference cell, e.g., interleaving the reference cells with the data cells and/or embedding the reference cells at an end of the row in accordance with one or more embodiments of the present disclosure, can help ensure that the path lengths from the control circuitry to the data cells and corresponding reference cells are the same or similar. This can help ensure accuracy in programming and/or sensing operations. For example, a difference in path lengths can result in a difference in the resistance along the paths. For programming and/or sensing operations that use a programming and/or sensing current, this difference in resistances can result in different programming and/or sensing currents being applied to data cells and corresponding reference cells which were intended to be programmed and/or sensed with the same current, particularly if the intended programming and/or sensing current is a low current. Having each row contain at least one reference cell, e.g., interleaving the reference cells with the data cells and/or embedding the reference cells at an end of the row, can ensure that the total resistances of the paths from the control circuitry to the data cells and corresponding reference cells track, e.g., are the same or similar, during programming and/or sensing operations. This can help ensure the same or similar programming and/or sensing current is applied to the data cells and corresponding reference cells which were intended to be programmed and/or sensed with the same current.

Figure 6:
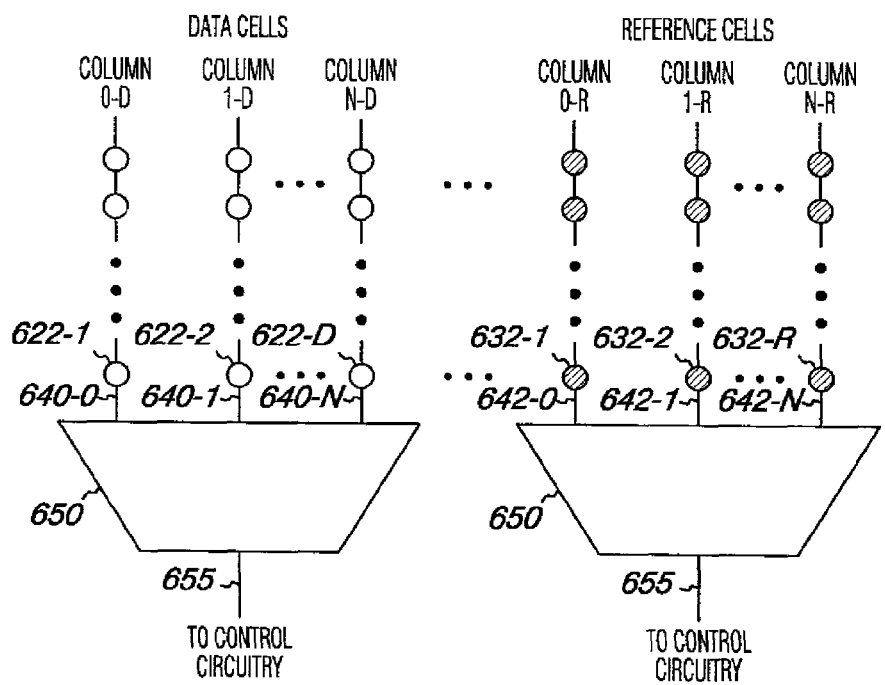
FIG. 6 is a schematic of a portion of a non-volatile memory array having column decoders in accordance with one or more embodiments of the present disclosure.

FIG. 6 illustrates a schematic of a portion of a non-volatile memory array, e.g., arrays 202 shown in FIG. 2 or array 300 shown in FIG. 3, having column decoders 650 in accordance with one or more embodiments of the present disclosure. Although FIG. 6 illustrates the non-volatile memory array as having two column decoders, embodiments of the present disclosure are not so limited, and may include non-volatile memory arrays having a number of column decoders. Further, although FIG. 6 illustrates the non-volatile memory array as having rows with reference cells embedded at an end of the rows, embodiments of the present disclosure are not so limited, and may include non-volatile memory arrays having rows in which reference cells are interleaved with data cells. As shown in FIG. 6, the array can include data cells, e.g., 622-1, 622-2, ..., 622-D, and reference cells, e.g., 632-1, 632-2, ..., 632-R, in accordance with one or more embodiments of the present disclosure. The data cells and reference cells can be arranged in rows coupled by select lines (not shown) and columns, e.g., COLUMN 0-D, COLUMN 1-D, ..., COLUMN N-D and COLUMN 0-R, COLUMN 1-R, ..., COLUMN N-R, coupled by sense lines, e.g., 640-0, 640-1, ..., 640-N and 642-0, 642-1, ..., 642-N, in accordance with one or more embodiments of the present disclosure. A column can be a sense line, e.g., sense line 312 shown in FIG. 3, to which a number of non-volatile memory cells, e.g., memory cell 315 shown in FIG. 3, are coupled, as previously described in connection with FIG. 3. The use of the term "columns" is not meant to imply a particular linear and/or vertical orientation of the memory cells. Rather, a column can mean a number of memory cells coupled to a particular sense line, regardless of the orientation of the memory cells. For example, a column can include a number of memory cells coupled to a particular sense line in a staggered, e.g., non-linear, orientation. The index "N" is used to indicate that the array can include a number of columns coupled by a number of sense lines, e.g., 16, 32, 64, etc. The indices "D" and "R" are used to distinguish columns containing data cells, e.g., 622-1, 622-2, ..., 622-D, from columns containing reference cells, e.g., 632-1, 632-2, ..., 632-R.

As shown in the embodiment of FIG. 6, the data cells and reference cells in each column can be coupled to a column decoder 650 by the sense lines. In the embodiment shown in FIG. 6, each data cell is coupled to a first column decoder, and each reference cell is coupled to a second column decoder. However, as previously discussed herein, embodiments of the present disclosure are not so limited. Column decoders 650 can also be coupled to control circuitry (not shown), e.g., control circuitry 204 shown in FIG. 2, by lines 655.

During a sensing operation, each column decoder 650 can receive reference levels, e.g., resistance levels, associated with the data cells and/or reference cells to which the column decoder is coupled via the sense lines. Each column decoder can be configured to multiplex out one of its received reference levels to the control circuitry via line 655. This enables the control circuitry to sequentially sense and compare the reference levels associated with the data cells and reference cells of the array.

Having each row in a resistance variable non-volatile memory array contain at least one reference cell, e.g., interleaving the reference cells with the data cells and/or embedding the reference cells at an end of the row in accordance with one or more embodiments of the present disclosure, can help ensure that the path lengths from the data cells and corresponding reference cells to the column decoders, and hence to the control circuitry, are the same or similar. This can help ensure accuracy during sensing operations, as previously described herein.

Figure 7:
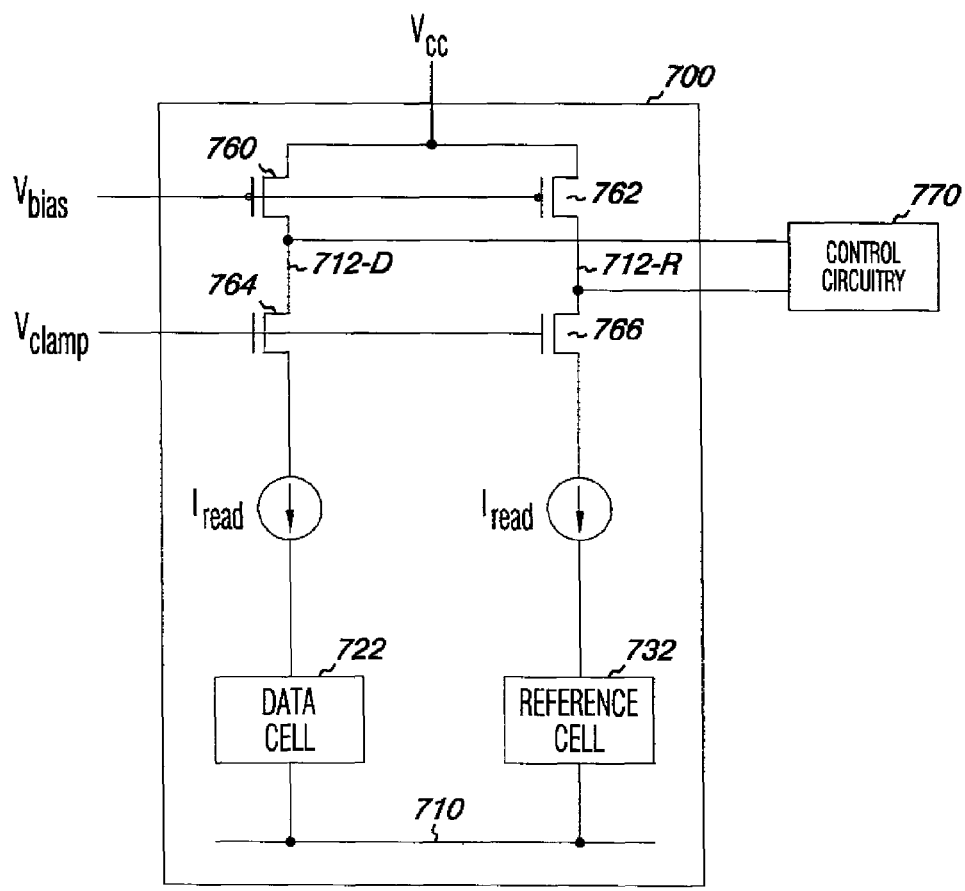
FIG. 7 is a schematic of a portion of a memory device in accordance with one or more embodiments of the present disclosure.

FIG. 7 illustrates a schematic of a portion of a memory device in accordance with one or more embodiments of the present disclosure.

FIG. 7 illustrates an embodiment of a non-volatile memory array 700, e.g., arrays 202 shown in FIG. 2 or array 300 shown in FIG. 3. As shown in FIG. 7, non-volatile memory array 700 can include data cell 722, e.g. data cells 422-1, 422-2, ..., 422-D and 424-1, 424-2, ..., 424-D shown in FIG. 4 or data cells 522-1, 522-2, ..., 522-D and 524-1, 524-2, ..., 524-D shown in FIG. 5, and reference cell 732, e.g., reference cells 432-1, 432-2, ..., 432-R and 434-1, 434-2, ..., 434-R shown in FIG. 4 or reference cells 532-1, 532-2, ..., 532-R and 534-1, 534-2, ..., 534-R shown in FIG. 5, in accordance with one or more embodiments of the present disclosure. Data cell 722 and reference cell 732 can be coupled to select line 710. Data cell 722 can be coupled to sense line 712-D, and reference cell 732 can be coupled to sense line 712-R. Non-volatile memory array 700 also can include transistors 760 and 764 coupled to sense line 712-D, and transistors 762 and 766 coupled to sense line 721-R. As shown in FIG. 7, transistors 760 and 762 can be PMOS transistors, and transistors 764 and 766 can be NMOS transistors. The transistors can also be coupled to a power source, e.g., V. Although the embodiment illustrated in FIG. 7 includes one data cell and one reference cell coupled to one select line, embodiments of the present disclosure are not so limited, and may include non-volatile memory arrays containing a number of data cells and reference cells coupled to a number of select lines and sense lines, as previously described herein.

The embodiment illustrated in FIG. 7 also includes control circuitry 770, e.g., control circuitry 204 shown in FIG. 2. Control circuitry 770 can include a sense amp (not shown) and/or a write driver (not shown). As shown in FIG. 7, control circuitry 770 can be coupled to data cell 722 via sense line 712-D and to reference cell 732 via sense line 712-R.

In one or more embodiments, at least one reference cell can be coupled to each select line in the array. This can help ensure that the paths coupling control circuitry 770 to the data cells, e.g., data cell 722, and corresponding reference cells, e.g., reference cell 732, are the same or similar length, which can result in various benefits, e.g., the paths having the same resistance, as previously discussed herein.

As shown in the embodiment of FIG. 7, voltage $V_{bias}$, e.g., $V_{cc}$=0.8V, can be applied to transistors 760 and 762, and voltage $V_{clamp}$, e.g., 1V, can be applied to transistors 764 and 766. These voltage applications can result in a current $I_{read}$ being applied to data cell 722 along sense line 712-D and to reference cell 732 along sense line 712-R. Current $I_{read}$ can be used to establish reference levels, e.g., resistance and/or voltage levels, associated with data cell X and reference cell Y. Current $I_{read}$ can be low, e.g., 1-10 microamps, so that the sensing operation does not affect the characteristics, e.g., reference levels, of data cell X and reference cell Y. In one or more embodiments, current $I_{read}$ can be applied to data cell X and reference cell Y simultaneously, which can help ensure that the cells experience the same program disturb conditions, e.g., temperature change, before their reference levels are established.

The established reference levels associated with data cell 722 and reference cell 732 can be sensed by the sense amp of control circuitry 770. Control circuitry 770 can also compare these reference levels to determine a data state, e.g., "0" or "1," of data cell 722.

In one or more embodiments, control circuitry 770 can combine two or more reference cells in parallel in order to define an intermediate reference level and/or data state. For example, control circuitry 770 can combine two reference cells each having target $R_t$ ranges with a resistance level of 200 k ohms in parallel in order to define an intermediate reference level corresponding to 100 k ohms. Such a procedure can reduce the accuracy needed during programming operations, and can provide a means to achieve resistance levels and/or data states that may be difficult and/or costly to achieve via programming.

In one or more embodiments, control circuitry 770 can include a write driver which can be used to program data cells and/or reference cells of non-volatile memory arrays in accordance with one or more embodiments of the present disclosure. Programming can include passing a particular write current through the data cells and/or reference cells. That is, passing the particular write current through the data cells and/or reference cells can result in the data cells and/or reference cells being set, e.g., programmed, within target $R_t$ ranges which can correspond to target data states, as previously described herein. These target $R_t$ ranges and/or target data states can be utilized in sensing operations, as previously described herein. Once the target $R_t$ ranges and/or target data states are programmed, the write current can be slowly decreased, e.g., rather than brought to zero instantaneously, in order to reduce a likelihood of alterations to the characteristics, e.g., resistance levels, of the data cells and/or reference cells.

As previously described herein, one or more embodiments of non-volatile memory arrays in accordance with the present disclosure can include multilevel data cells and/or multilevel reference cells. A programming operation for programming multilevel cells can include initially applying a programming current consistent with programming a cell to an uppermost target $R_t$ level and/or target $R_t$ range to all the cells intended to be programmed. The programming current can then be lowered and successively increased through the cells which are intended to be programmed to lower target $R_t$ levels and/or within lower target $R_t$ ranges until all desired target $R_t$ levels and/or target $R_t$ ranges have been programmed.

As an example, assume a programming operation for a four-level multilevel reference cell designed to program one reference cell, e.g., $R_1$, to a target $R_t$ level of 1M ohm, a second reference cell, e.g., $R_t$, to a target $R_t$ level of 600 k ohms, a third reference cell, e.g., $R_3$, to a target $R_t$ level of 300 k ohms, and a fourth reference cell, e.g., $R_4$, to a target $R_t$ level of 30 k ohms. Note that, as previously described herein, these reference cells can also be programmed within target $R_t$ ranges that include these resistance levels. First, a programming current of 650 microamps can be applied to all four reference cells, e.g., $R_1$, $R_2$, $R_3$, and $R_4$, to program the four reference cells to an intended target $R_t$ level of 1M ohm. Next, a programming current of 600 microamps can be applied to reference cells $R_2$, $R_3$, and $R_4$ to program these three reference cells to an intended target $R_t$ level of 600 k ohms. Next, a programming current of 550 microamps can be applied to reference cells $R_3$ and $R_4$ to program these two reference cells to an intended target $R_t$ level of 300 k ohms. Finally, a programming current of 500 microamps can be applied to reference cell $R_4$ to program this reference cell to an intended target $R_t$ level of 30 k ohms.

In one or more embodiments, data cells and/or reference cells of a non-volatile memory array in accordance with one or more embodiments of the present disclosure can be programmed dynamically. In one or more embodiments, dynamic programming can include programming the data cells and/or reference cells simultaneously during a data programming operation.

Although several methods of programming and sensing resistance variable non-volatile memory cells have been described herein, embodiments of the present disclosure are not limited to these methods, and may include other programming methods.

Figure 8:
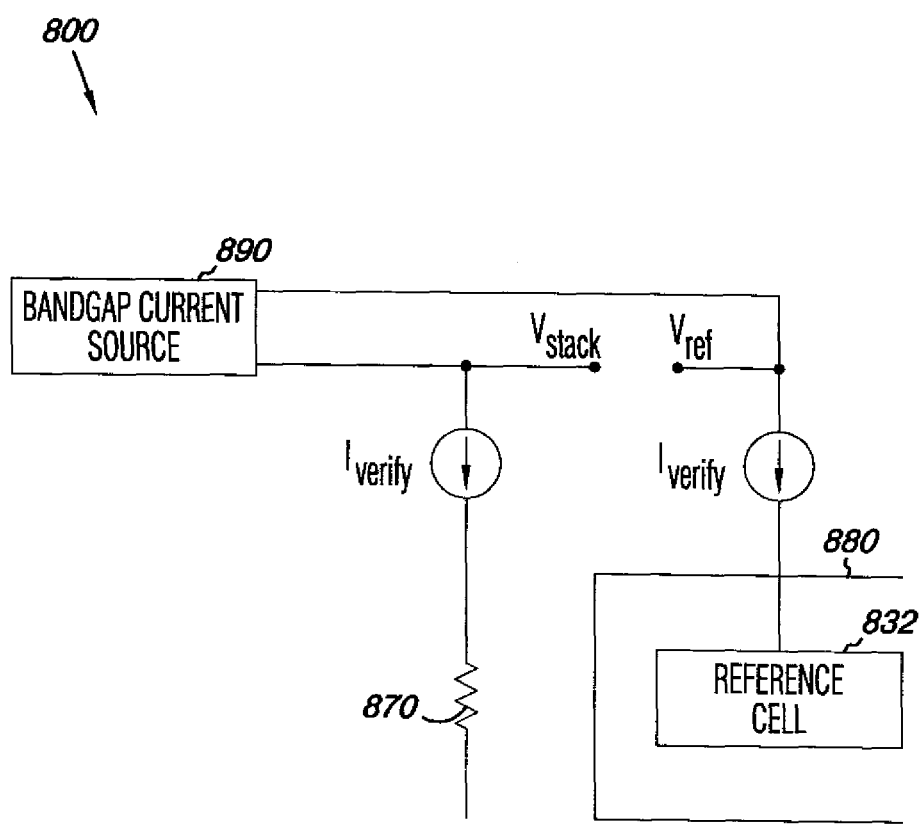
FIG. 8 is a schematic of a portion a memory device that can be used with a programming verification scheme in accordance with one or more embodiments of the present disclosure.

FIG. 8 illustrates a schematic of a portion of a memory device that can be used with a programming verification scheme 800 in accordance with one or more embodiments of the present disclosure. However, embodiments of the present disclosure are not limited to the particular programming verification scheme shown in FIG. 8, and may include other programming verification schemes.

As shown in the embodiment illustrated in FIG. 8, programming scheme 800 can include a trimmable resistor stack 870 located in the periphery of a memory chip, e.g., memory chip 200 shown in FIG. 2, in accordance with one or more embodiments of the present invention. The memory chip can also include a non-volatile memory array 880, e.g., arrays 202 shown FIG. 2 or array 300 shown in FIG. 3, which can include one or more reference cells, e.g., reference cell 832, and/or one or more data cells (not shown) in accordance with one or more embodiments of the present invention. Although array 880 illustrated in FIG. 8 includes one reference cell, embodiments of the present disclosure are not so limited, and array 880 may include a number of reference cells, as previously described herein.

In the embodiment illustrated in FIG. 8, reference cell 832 has previously been programmed within a target $R_t$ range which can correspond to a target data state, in accordance with one or more embodiments of the present disclosure.

As shown in FIG. 8, trimmable resistor stack 870 and reference cell 832 can be coupled to a bandgap current source 890. Bandgap current source 890 can be, for example, a standard CMOS bandgap, as will be understood by one of ordinary skill in the art.

In the embodiment illustrated in FIG. 8, trimmable resistor stack 870 can be trimmed to a resistance level, e.g., $R_{stack}$, within the target $R_t$ range within which reference cell 832 has been programmed. In one or more embodiments, $R_{stack}$ can be the resistance level to which reference cell 832 was intended to be programmed.

As shown in FIG. 8, bandgap current source 890 can supply a verification current $I_{verify}$, to trimmable resistor stack 870 and reference cell 832, and the voltages $V_{stack}$ and $V_{ref}$ across trimmable resistor stack 870 and reference cell 832 can be measured. The target $R_t$ range and/or target data state within/ to which reference cell X was programmed can be verified by calculating the actual resistance level, e.g., $R_{ref}$, associated with reference cell 832 according to the formula:

$$R_{ref} = V_{ref}/I_{verify}$$

and comparing:

$$V_{stack} = (I_{verify})(R_{stack})$$

with $$V_{ref} = (I_{verify})(R_{ref}).$$

Figure 9:
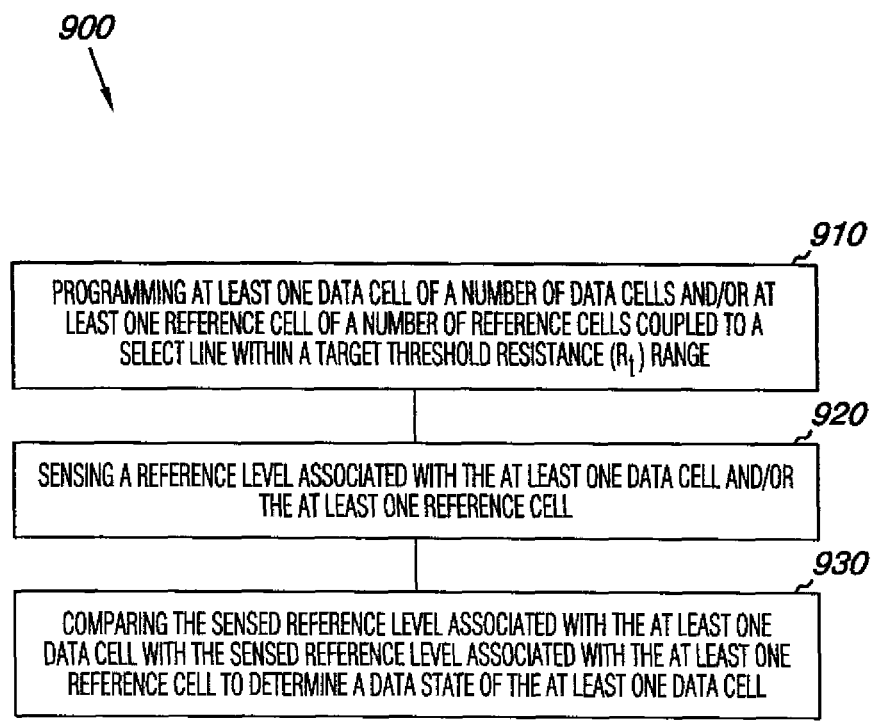
FIG. 9 is an embodiment of a method for operating an array of non-volatile memory cells in accordance with one or more embodiments of the present disclosure.

FIG. 9 illustrates an embodiment of a method 900 for operating an array of non-volatile memory cells in accordance with one or more embodiments of the present disclosure. However, embodiments of the present disclosure are not limited to the particular method illustrated in FIG. 9, and may include other methods.

At block 910, method 900 can include programming at least one data cell of a number of data cells and/or at least one reference cell of a number of reference cells coupled to a select line within a target threshold resistance ($R_t$) range. In one or more embodiments, the data cells and reference cells can be resistance variable memory cells, e.g., programmable conductor memory cells, PCRAM cells, or RRAM cells, which contain resistance variable memory elements, e.g., a phase change element or a resistive switching element. In one or more embodiments, the data cells and reference cells can be PCRAM cells made from a chalcogenide alloy of germanium, antimony, and tellurium (GST).

In one or more embodiments, the target $R_t$ range can correspond to one of a number of data states. In one or more embodiments, the number of reference cells can form at least one group of reference cells, and each reference cell in a group can be programmed within a particular target $R_t$ range. In one or more embodiments, the at least one reference cell or group of reference cells can be interleaved with the number of data cells. In one or more embodiments, the at least one reference cell or group of reference cells can be embedded at an end of the select line. In one or more embodiments, the at least one data cell and the at least one reference cell can be programmed simultaneously during a data programming operation. In one or more embodiments, the at least one reference cell can be programmed with a trimmable resistor stack.

At block 920, method 900 can include sensing a reference level associated with the at least one data cell and/or the at least one reference cell. In one or more embodiments, the method can include combining in parallel at least two reference cells to define an intermediate data state. In one or more embodiments, the method can include sensing the at least one data cell and the at least one reference cell with a current of 1-10 microamps. In one or more embodiments, the method can include sensing the at least one data cell and the at least one reference cell with a current of 1-10 microamps simultaneously. In one or more embodiments, the method can include sensing the reference levels associated with the at least one data cell and the at least one reference cell simultaneously. In one or more embodiments, the sensed reference levels can be resistance levels. In one or more embodiments, the method can include sensing a reference level associated with the at least one group of reference cells. In one or more embodiments, the method can include sensing a reference level associated with each reference cell in the at least one group of reference cells. In one or more embodiments, the method can include determining an average of the sensed reference levels associated with each reference cell in the at least one group of reference.

At block 930, method 900 can include comparing the sensed reference level associated with the at least one data cell with the sensed reference level associated with the at least one reference cell to determine a data state of the at least one data cell. In one or more embodiments, the method can include comparing the sensed reference level associated with the at least one data cell with the sensed reference level associated with the group of reference cells. In one or more embodiments, the method can include determining whether an $R_t$ level of the at least one data cell is greater and/or lower than an $R_t$ level of the at least one reference cell.

Figure 10:
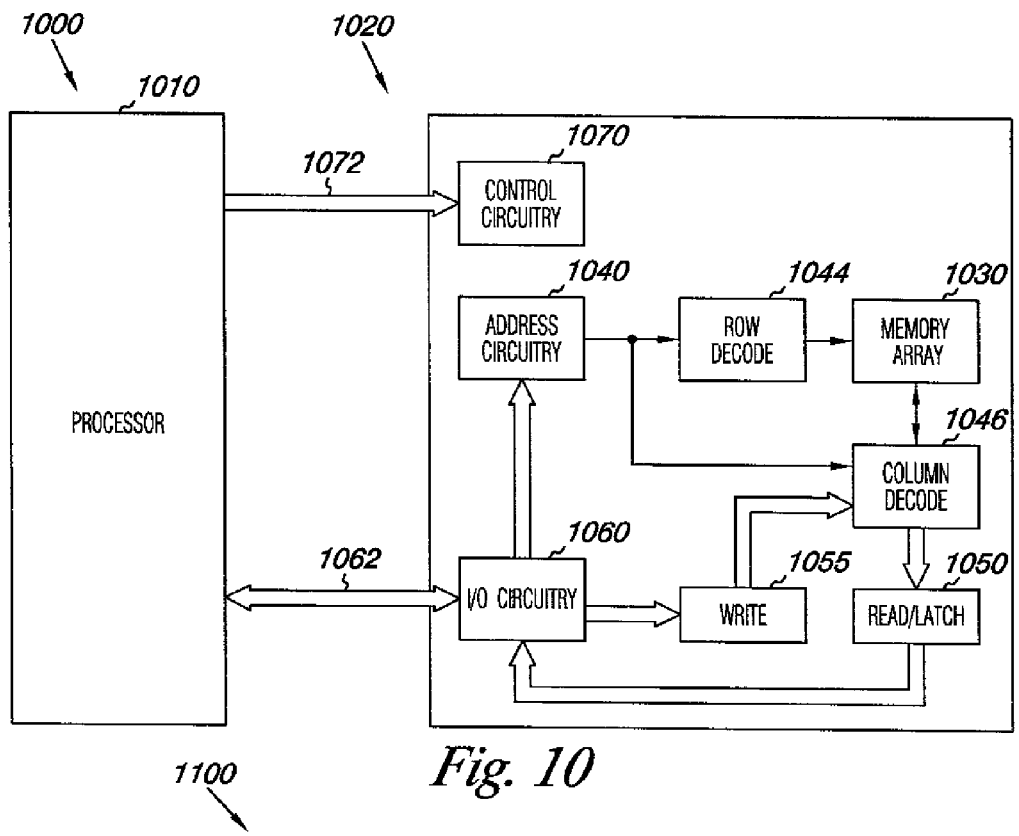
FIG. 10 is a functional block diagram of an electronic memory system having at least one memory device in accordance with one or more embodiments of the present disclosure.

FIG. 10 is a functional block diagram of an electronic memory system 1000 having at least one memory device 1020 operated in accordance with one or more embodiments of the present disclosure. Memory system 1000 can include a processor 1010 coupled to a memory device 1020 that can include a memory array 1030 of memory cells. The memory system 1000 can include separate integrated circuits or both the processor 1010 and the memory device 1020 can be on the same integrated circuit. The processor 1010 can be a microprocessor or some other type of controlling circuitry such as an application-specific integrated circuit (ASIC).

The memory device 1020 can include an array of memory cells 1030, which can be resistance variable memory cells with a PCRAM architecture, for example. The embodiment of FIG. 10 includes address circuitry 1040 to latch address signals provided over I/O connections 1062 through I/O circuitry 1060. Address signals can be received and decoded by a row decoder 1044 and a column decoder 1046 to access the memory array 1030. It will be appreciated by those skilled in the art that the number of address input connections can depend on the density and architecture of the memory array 1030 and that the number of addresses can increase with both increased numbers of memory cells and increased numbers of memory blocks and arrays.

The memory array 1030 can include multilevel memory cells having different numbers of programmed levels, sensing references, etc., according to embodiments described herein. The read/latch circuitry 1050 can read and latch a page or row of data from the memory array 1030. I/O circuitry 1060 can be included for bi-directional data communication over the I/O connections 1062 with the processor 1010. Write circuitry 1055 can be included to write data to the memory array 1030.

Control circuitry 1070 can decode signals provided by control connections 1072 from the processor 1010. These signals can include chip signals, write enable signals, and address latch signals that are used to control the operations on the memory array 1030, including data sensing, data write, and data erase operations. In one or more embodiments, the control circuitry 1070 can be responsible for executing instructions from the processor 1010 to perform the operations according to embodiments of the present disclosure. The control circuitry 1070 can be a state machine a sequencer, or some other type of controller. It will be appreciated by those skilled in the art that additional circuitry and control signals can be provided, and that the memory device detail of FIG. 10 has been reduced to facilitate ease of illustration.

Figure 11:
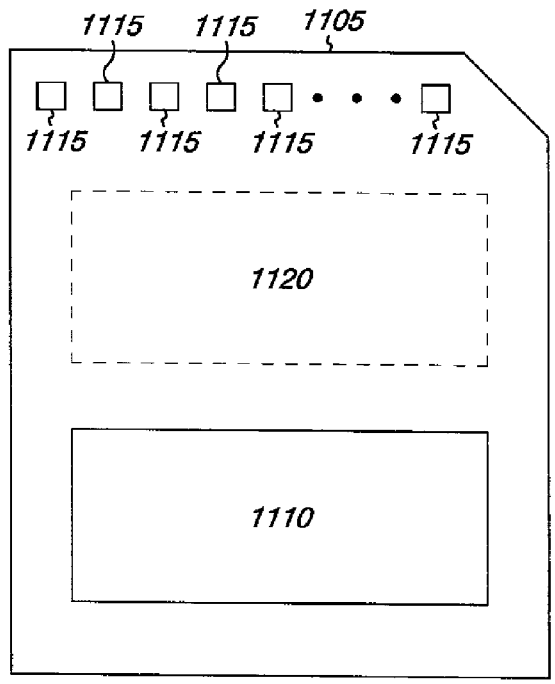
FIG. 11 is a functional block diagram of a memory module having at least one memory device in accordance with one or more embodiments of the present disclosure.

FIG. 11 is a functional block diagram of a memory module 1100 having at least one memory device 1110 in accordance with one or more embodiments of the present disclosure. Memory module 1100 is illustrated as a memory card, although the concepts discussed with reference to memory module 1100 are applicable to other types of removable or portable memory (e.g., USB interface drives) and are intended to be within the scope of "memory module" as used herein. In addition, although one example form factor is depicted in FIG. 11, these concepts are applicable to other form factors as well.

In one or more embodiments, memory module 1100 can include a housing 1105 (as depicted) to enclose one or more memory devices 1110, though such a housing is not essential to all devices or device applications. At least one memory device 1110 can include an array of multilevel memory cells that can be sensed according to embodiments described herein. Where present, the housing 1105 includes one or more contacts 1115 for communication with a host device. Examples of host devices include digital cameras, digital recording and playback devices, PDAs, personal computers, memory card readers, interface hubs and the like. For one or more embodiments, the contacts 1115 are in the form of a standardized interface. For example, with a USB interface drive, the contacts 1115 might be in the form of a USB Type-A male connector. In general, contacts 1115 can provide an interface for passing control, address and/or data signals between the memory module 1100 and a host having compatible receptors for the contacts 1115.

The memory module 1100 may optionally include additional circuitry 1120, which may be one or more integrated circuits and/or discrete components. For some embodiments, the additional circuitry 1120 may include control circuitry, such as a memory controller, for controlling access across multiple memory devices 1110 and/or for providing a translation layer between an external host and a memory device 1110. For example, there may not be a one-to-one correspondence between the number of contacts 1115 and a number of 1110 connections to the one or more memory devices 1110. Thus, a memory controller could selectively couple an I/O connection (not shown in FIG. 11) of a memory device 1110 to receive the appropriate signal at the appropriate I/O connection at the appropriate time or to provide the appropriate signal at the appropriate contact 1115 at the appropriate time. Similarly, the communication protocol between a host and the memory module 1100 may be different than what is required for access of a memory device 1110. A memory controller could then translate the command sequences received from a host into the appropriate command sequences to achieve the desired access to the memory device 1110. Such translation may further include changes in signal voltage levels in addition to command sequences.

The additional circuitry 1120 may further include functionality unrelated to control of a memory device 1110 such as logic functions as might be performed by an ASIC. Also, the additional circuitry 1120 may include circuitry to restrict read or write access to the memory module 1100, such as password protection, biometrics or the like. The additional circuitry 1120 may include circuitry to indicate a status of the memory module 1100. For example, the additional circuitry 1120 may include functionality to determine whether power is being supplied to the memory module 1100 and whether the memory module 1100 is currently being accessed, and to display an indication of its status, such as a solid light while powered and a flashing light while being accessed. The additional circuitry 1120 may further include passive devices, such as decoupling capacitors to help regulate power requirements within the memory module 1100.

CONCLUSION

Devices and methods for operating resistance variable memory are disclosed. One or more embodiments use reference cells embedded with data cells as part of a sensing scheme that can have greater immunity to temperature changes and/or can be applicable to both single level and multilevel resistance variable memories.

One device embodiment can include an array of memory cells, wherein a number of the memory cells are commonly coupled to a select line. The aforementioned number of memory cells can include a number of data cells, each of which being programmable within a number of target threshold resistance ($R_t$) ranges which correspond to a number of data states, and a number of reference cells interleaved with the data cells, wherein each of the number of reference cells being programmable within the number of target $R_t$ ranges. The aforementioned device can also include control circuitry coupled to the array of memory cells and configured to sense a level associated with at least one data cell, sense a level associated with at least one reference cell, and compare the sensed level associated with the at least one data cell with the sensed level associated with the at least one reference cell to determine a data state of the at least one data cell.

One method embodiment can include programming at least one data cell of a number of data cells coupled to a select line within a target threshold resistance ($R_t$) range corresponding to one of a number of data states, sensing a level associated with the at least one data cell and at least one reference cell coupled to the select line and interleaved with the number of data cells, and comparing the sensed level associated with the at least one data cell with the sensed level associated with the at least one reference cell to determine a data state of the at least one data cell.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device, comprising:
    an array of memory cells, wherein a number of the memory cells are commonly coupled to a select line, the number of memory cells including:
        a number of data cells; and
        a number of reference cells, wherein the reference cells are interleaved with the data cells; and
    control circuitry coupled to the array, wherein:
        the control circuitry is coupled to the data cells by a first path having a particular length; and the control circuitry is coupled to the reference cells by a second path having a length approximately equal to the particular length of the first path.

2. The memory device of claim 1, wherein the data cells and reference cells are resistance variable memory cells.

3. The memory device of claim 1, wherein the control circuitry is configured to program at least one data cell and at least one reference cell to within one particular target threshold resistance (Rt) range of a number of target Rt ranges.

4. The memory device of claim 3, wherein:
the memory device includes a trimmable resistor stack; and
the control circuitry is configured to verify the programmed target Rt range of the at least one reference cell using the trimmable resistor stack.

5. A memory device, comprising:
an array of memory cells, wherein a number of the memory cells are commonly coupled to a select line, the number of memory cells including:
 a number of data cells; and
 a number of reference cells;
 wherein each of the data cells and reference cells are programmable to within a number of target threshold resistance (Rt) ranges; and
control circuitry coupled to the array, wherein:
 the control circuitry is coupled to the data cells by a first path having a particular resistance;
 the control circuitry is coupled to the reference cells by a second path having a resistance approximately equal to the particular resistance of the first path; and
 the control circuitry is configured to:
  sense a level associated with at least one data cell by applying a current of 1-10 microamps to the at least one data cell;
  sense a level associated with at least one reference cell; and
  compare the sensed level associated with the at least one data cell with the sensed level associated with the at least one reference cell to determine whether an Rt level of the at least one data cell is greater than an Rt level of the at least one reference cell.

6. The memory device of claim 5, wherein the control circuitry is configured to sense the level associated with the at least one data cell by combining in parallel at least two reference cells previously programmed to within one of the target Rt ranges to define an intermediate data state.

7. The memory device of claim 5, wherein the control circuitry is configured to sense the level associated with the at least one reference cell by applying a current of 1-10 microamps to the at least one reference cell.

8. The memory device of claim 5, wherein the control circuitry is configured to sense the level associated with the at least one data cell and the level associated with the at least one reference cell substantially simultaneously.

9. The memory device of claim 5, wherein the reference cells are embedded at an end of the select line.

10. The memory device of claim 5, wherein the memory device includes:
a first column decoder coupled to the data cells and the control circuitry; and
a second column decoder coupled to the reference cells and the control circuitry.

11. The memory device of claim 10, wherein:
the first column decoder is configured to multiplex out a selected level associated with a selected data cell to the control circuitry; and
the second column decoder is configured to multiplex out a selected level associated with a selected reference cell to the control circuitry.

12. The memory device of claim 5, wherein the number of target Rt ranges correspond to a number of data states.

13. A memory device, comprising:
an array of memory cells, wherein a number of the memory cells are commonly coupled to a select line, the number of memory cells including:
 a number of data cells programmable to within a number of target threshold resistance (Rt) ranges which correspond to a number of data states; and
 a number of reference cells interleaved with and interspersed among the data cells and programmable to within the number of Rt ranges; and
control circuitry coupled to the array and configured to determine a data state of at least one of the data cells.

14. The memory device of claim 13, wherein the number of memory cells include:
a first group of reference cells interleaved with the data cells and programmable to within the number of Rt ranges; and
a second group of reference cells interleaved with the data cells and programmable to within the number of Rt ranges.

15. The memory device of claim 14, wherein the first and second groups of reference cells each include a number of adjacent reference cells.

16. The memory device of claim 14, wherein the control circuitry is configured to:
sense a resistance level associated with each reference cell in the first group and a resistance level associated with each reference cell in the second group; and
determine an average of the sensed resistance levels associated with each reference cell in the first group and an average of the sensed resistance levels associated with each reference cell in the second group.

17. A memory device, comprising:
an array of memory cells, wherein a number of the memory cells are commonly coupled to a select line, the number of memory cells including:
 a number of data cells; and
 a number of reference cells;
a trimmable resistor stack; and
control circuitry coupled to the array, wherein:
 the control circuitry is coupled to the data cells by a first path having a particular length;
 the control circuitry is coupled to the reference cells by a second path having a length approximately equal to the particular length of the first path; and
 the control circuitry is configured to:
  program at least one data cell and at least one reference cell to within one particular target threshold resistance (Rt) range of a number of target Rt ranges; and
  verify the programmed target Rt range of the at least one reference cell using the trimmable resistor stack.

18. A memory device, comprising:
an array of memory cells, wherein a number of the memory cells are commonly coupled to a select line, the number of memory cells including:
 a number of data cells; and
 a number of reference cells;
 wherein each of the data cells and reference cells are programmable to within a number of target threshold resistance (Rt) ranges; and control circuitry coupled to the array, wherein:
- the control circuitry is coupled to the data cells by a first path having a particular resistance;
- the control circuitry is coupled to the reference cells by a second path having a resistance approximately equal to the particular resistance of the first path; and
- the control circuitry is configured to:
  - sense a level associated with at least one data cell;
  - sense a level associated with at least one reference cell by applying a current of 1-10 microamps to the at least one reference cell; and
  - compare the sensed level associated with the at least one data cell with the sensed level associated with the at least one reference cell to determine whether an Rt level of the at least one data cell is greater than an Rt level of the at least one reference cell.

19. A memory device, comprising:
- an array of memory cells, wherein a number of the memory cells are commonly coupled to a select line, the number of memory cells including:
  - a number of data cells programmable to within a number of target threshold resistance (Rt) ranges which correspond to a number of data states;
  - a first group of reference cells interleaved with the data cells and programmable to within the number of Rt ranges; and
  - a second group of reference cells interleaved with the data cells and programmable to within the number of Rt ranges; and
- control circuitry coupled to the array and configured to determine a data state of at least one of the data cells.

* * * * *